United States Patent [19]

Schroder

[11] 4,041,370
[45] Aug. 9, 1977

[54] APPARATUS FOR RAPIDLY DETECTING AND CALCULATING THE ROOT MEAN SQUARE OF ELECTRICAL MEASURING VALUES IN ALTERNATING CURRENT NETWORKS

[75] Inventor: Dierk Schröder, Hohensachsen, Germany

[73] Assignee: BBC Brown Boveri & Company Limited, Baden, Switzerland

[21] Appl. No.: 618,403

[22] Filed: Oct. 1, 1975

[30] Foreign Application Priority Data

Oct. 2, 1974 Germany .............................. 2446943

[51] Int. Cl.² .............................................. H02J 3/18
[52] U.S. Cl. ........................................ 323/8; 323/119
[58] Field of Search .................... 323/7, 8, 17, 20, 24, 323/101, 102, 105, 108, 109, 119, 127; 318/596, 597, 609, 610

[56] References Cited

U.S. PATENT DOCUMENTS

| | | | |
|---|---|---|---|
| 3,900,792 | 8/1975 | Möltgen | 323/119 X |
| 3,906,337 | 9/1975 | Depenbrock | 323/119 X |
| 3,936,727 | 2/1976 | Kelley et al. | 323/102 |
| 3,940,687 | 2/1976 | Akhundov et al. | 323/101 |

Primary Examiner—A. D. Pellinen
Attorney, Agent, or Firm—Pierce, Scheffler & Parker

[57] ABSTRACT

A method for rapid acquisition and handling of root mean square values of the time dependent current and/or voltage in single or multi-phase a.c. mains wherein each of these values is converted into two intermediate values shifted in phase by 90° and fed into a computer circuit the output of which provides analog d.c. signals indicating the reactive or actual power, or the r.m.s. values of the voltage and current dependent upon the particular type of computer which is used. The analog d.c. signals are fed into a following regulator unit having an integrating portion to adjust a regulating value to serve as a nominal value which is then compared with an applied actual value and the difference therebetween is then fed into the regulator unit. The control signal at the output of the regulator unit is read periodically and transmitted to a final control element and the regulating value is adjusted during the course of one or a fraction of one cycle of the a.c. mains frequency.

9 Claims, 12 Drawing Figures

APPARATUS FOR RAPIDLY DETECTING AND CALCULATING THE ROOT MEAN SQUARE OF ELECTRICAL MEASURING VALUES IN ALTERNATING CURRENT NETWORKS

The present invention concerns a method for rapid acquisition and evaluation of root mean squares of electric values measured in single- or multi-phase a.c. mains, the values being in the form of time-dependent values, measuring the alternating current and/or voltage of the respective a.c. mains, converted into two intermediate items which in each given case are offset in phase by 90°, and which can be picked up in a computing circuit an analog d.c. signals, indicating the actual or the reactive power or the effective, i.e. the r.m.s. value of the a.c. voltage or current. The invention concerns further a circuit arrangement for the practical application of the above-described method.

Systems which are designed to balance the reactive power consumption of loads, or to balance asymmetric real power loads, require a rapid and precise determination of the real and the reactive power consumption of a load. It is possible to determine the real and the reactive power consumption at certain instants of time from the instantaneous values of the time-dependent load currents, and from the phase difference between the zero transitions of the alternating voltages and the load currents. However, this measuring technique can be employed only if the measuring signals are free of harmonics, and is therefore unsuitable for loads where the measuring signals contain a great amount of harmonics.

Another method, the so-called power component technique, where the load voltage and the load current are multiplied with each other and the product is integrated over a certain period of time, has the disadvantage of a relatively long measuring time, thus influencing adversely the dynamics of rapidly operating installations.

The periodical "Technische Mitteilungen AEG - Telefunken" vol. 61 (1971) discloses on pages 327 and following a measuring technique where reference signals, obtained from the alternating voltage and current of the a.c. mains, are converted in each given case into two signals of intermediate items which are phase-shifted by 90° relative to each other. These intermediate items are then used to determine the actual power, for example by multiplying the lagging current signal with the lagging voltage signal, and the leading voltage signal with the leading current signal, thus forming two signals of intermediate items, and a direct current signal, which is time-invariant and proportional to the actual power, is then generated by the summation of the two intermediate signal items. This method has the disadvantage that in case of measuring signals containing harmonics it would become necessary to make allowance for any frequency being part of this signal and to shift the associated harmonic signal by the phase angle required at the fundamental frequency. However, circuits allowing such transient responses —that is a constant phase angle within the total frequency range at constant transfer ratio— are not practical for a so-called real time operation.

It is the principal object of the invention to create a measuring method which will supply rapid measuring values for a regulating circuit to monitor the reactive and/or actual load of a single- or multi-phase a.c. mains, where any harmonics arising within the measuring signal will not falsify the measuring results in stationary operation, and where it is possible to process also measuring signals which are not continuous either themselves or in their first derivation, and to establish a circuit arrangement for the practical application of this method.

It is a principal characteristic of the method proposed by the invention that the analog d.c. signals are fed into a following regulator unit with an integral factor to adjust a regulating value to serve as a nominal value, that the nominal value is compared with an applied actual value and the difference signal between nominal and actual value is fed into the regulator unit, that the regulating signal value is read periodically at the regulator unit output end and then transmitted to a final control element, and that the regulating value is adjusted during the course of the system duration of the a.c. mains frequency, or during fractions of this cycle duration.

A circuit arrangement for the practical application of this method is characterized by the features that the computing circuitry is followed by a regulator unit circuit to adjust an electric value of the a.c. mains load to serve as the regulating value, with the analog d.c. signals from the output end of the computing circuitry being transmitted to the regulator unit circuit to serve as the nominal value, that the regulator unit possesses an integral portion, that the regulator unit signal is transmitted to the final control element by way of a reader which contains a hold element, and that any adjustment is accomplished during the course of one cycle duration of the a.c. mains frequency, or during fractions of this cycle duration.

This arrangement attains in an advantageous manner an error-free averaging of the signals of the nominal value and the actual value signals because any deviation of the mean instant vlue from the mean nominal value will cause a change in the output signal of the regulator unit, and thus a change in the drive of the final control element.

The invention will be explained in detail on the basis of a preferred embodiment which is illustrated in the accompanying drawings wherein.

Figure 1:
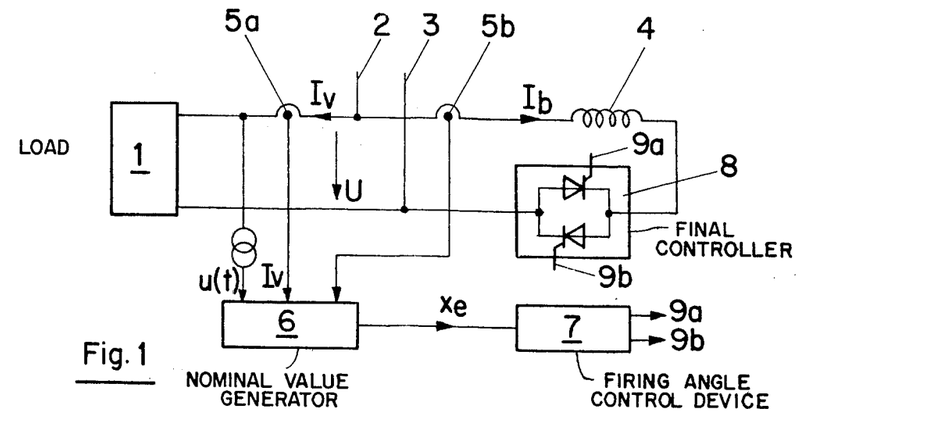
FIG. 1 depicts a load with greatly fluctuating reactive load behavior, where the power factor is kept at a preset value by means of a regulator circuit with add-on auxiliary reactance or a reactance transformer the secondary of which can be short-circuited.

With reference now to FIG. 1, a load 1 is provided with a.c. network current by way of terminals 2,3. The a.c. network can be single-phase, but it is also possible to connect, for example, the phases R/Mp of a poly-phase mains to the terminals 2,3. It is also possible to design the load 1 as a three-phase unit. An auxiliary inductive reactance 4 is connected in parallel with the load 1 by way of a final control element 8 which is constructed in the form of two thyristors connected anti-parallel. The load current Iv is measured in the current transformer 5a, and the reactance current Ib is measured in the unit 5b. Iv and Ib are the signal outputs of the current transformers 5a and 5b. Iv is identical with the input signal $i(t)$ of the nominal-value generator 6. $Iv = i(t)$ is that current signal which is phase-rotated in one or the other direction by the computer circuit of the nominal-value generator 6. Ib is identical with the input signal $I_{ist}$ of the nominal-value generator 6. This signal $Ib = I_{ist}$ is fed into the nominal-value generator 6 and represents the actual value. A differential signal is formed from this actual value and the signal output of the computer circuit, used as the nominal-value, and this differential signal is fed into the regulator 14 of the nominal value generator 6. The data are then fed into the nominal value generator 6, proposed by the invention, which processes not only the measuring signal Iv for the load current but also the measuring signal $u(t)$ for the load voltage. Across the output end of the nominal value generator 6 there if formed a voltage $x_e$ which is transmitted to the thyristor firing angle control unit 7, its outputs 9a and 9b being connected to the associated control inputs 9a and 9b of the final control element 8.

Figure 2:
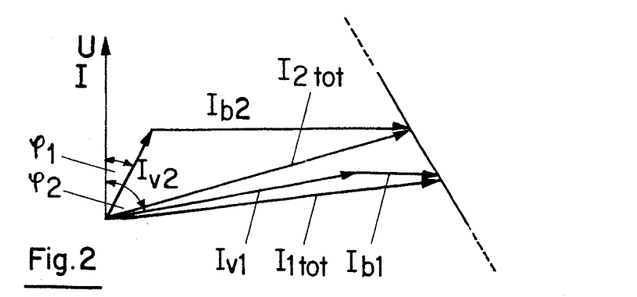
FIG. 2 shows the current-voltage graph of the load with the reactance transformer connected in parallel, in accordance with FIG. 1.

The regulating system shown by FIG. 1 operates in the following manner:

In order to avoid any collapse of the voltage due to a sudden reactive consumption by the load 1, or in order to keep constant the power factor respectively, there is drawn off a substantially constant reactive current $I_b$ total by firing the thyristors of the element 8 in the time interval after the occurrence of the maximum of the load voltage. A load current $I_{v1}$ will cause the flow of a reactive current $I_{b1}$ through the thyristors (or a triac could also be used in their place), with the two currents $I_{v1}$ and $I_{b1}$ forming cumulatively a total current $I_{1\ tot}$ (see FIG. 2).

If, however, the load 1 draws a current $I_{v2}$ of lesser magnitude, a higher reactive current $I_{b2}$ will be drawn due to an advanced activation of the a.c. control elements formed by the thyristors 8, and the total current, resulting from $I_{v2}$ plus $I_{b2}$, will be represented by $I_{2\ total}$. A slight change in the reactive current consumption is necessary due to the change in the actual current consumption, generating a change in the longitudinal voltage drop. However, it is possible to compensate for this change in the longitudinal voltage drop by a slight contra-change in the reactive current consumption. Thus, the reactive current, drawn off the a.c. mains at the terminals 2, 3, will be substantially constant so that it will become possible to compensate for any sudden demand for reactive power by reducing the firing angle at at the thyristors of the a.c. controller 8.

However, in order to do so it is absolutely necessary to determine and handle rapidly the reactive power requirement of the load 1, that is to determine from the measuring signal through the nominal value generator 6 the instantaneous requirement for reactive power and to transmit such data to the thyristor firing angle control unit 7 which will then influence accordingly the thyristors of the a.c. controller 8, in series with the auxiliary reactance 4 (see FIG. 1).

Figure 1A:
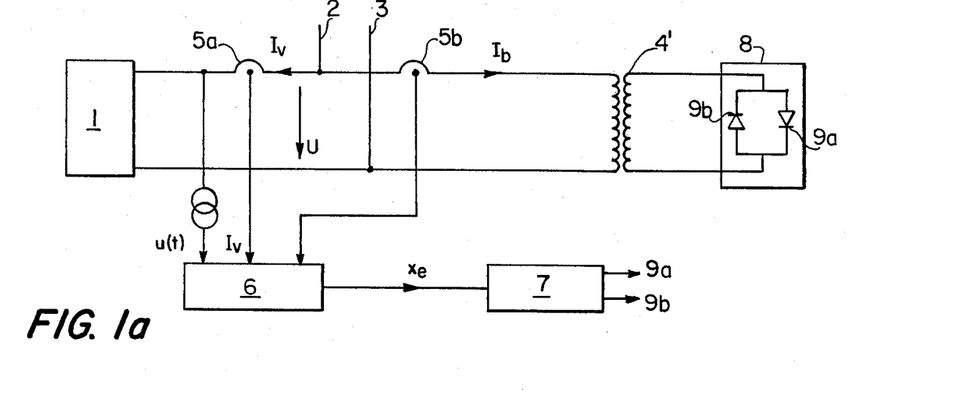
FIG. 1a is a view similar to FIG. 1 illustrating a modified embodiment.

FIG. 1a illustrates a modification of the arrangement shown in FIG. 1, wherein the inductive reactance component is constituted by a leakage reactance transformer 4' whose primary is connected in parallel with the load circuit and wherein the means for adjusting the current flow through the reactance is constituted by a two-way semi-conductor control arrangement 9a, 9b connected to the secondary of this transformer and controlled by the means 6 which periodically read the output signal from the regulator.

If nominal value generators are used for inputs to circuits regulating reactive power, actual power or voltages, it becomes important to eliminate the influence of harmonics in the measuring signal, and thus eliminating any errors resulting therefrom.

The signal $i(t) = I_v$ fed into the nominal value generator 6 is determined by the equation $$i(t) = \hat{i}_1 \sin \omega t + \hat{i}_3 \sin 3 \omega t$$

In this equation there is incorporated, in addition to the fundamental wave $\hat{i}_1$ of the current, the third harmonic $\hat{i}_3$. The signal $u(t)$ which is fed into the nominal-value generator 6 is determined by the equation $$u(t) = \hat{u}_1 \sin \omega t$$

By multiplying the two equations with each other, one arrives at the following equation:

$$P(t) = 0.5\, \hat{u}_1 \cdot \hat{i}_1 (1 - \cos 2 \omega t) + 0.5\, \hat{u}_1 \cdot \hat{i}_3 (\cos 2 \omega t - \cos 4 \omega t)$$

As the product of the phase-rotated signals $u(t)$ and $i(t)$ one arrives at a signal expressed by the equation:

$$P_g(t) = 0.5\, \hat{u}_1 \cdot \hat{i}_1 (1 + \cos 2 \omega t) - 0.5\, \hat{u}_1 \cdot \hat{i}_3 (x \sin 2 \omega t + x \sin 4 \omega t - y \cos 2 \omega t - y \cos 4 \omega t)$$

Figure 4:
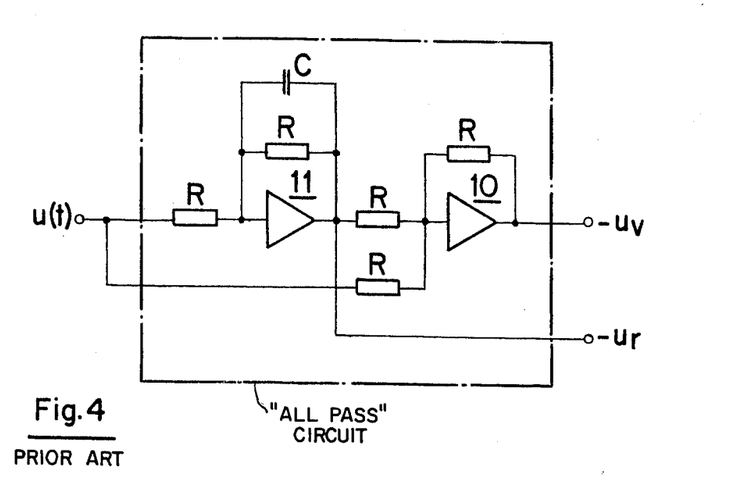
FIG. 4 shows a known all-pass circuit arrangement for phase rotation of the measuring value signals in the nominal value generators depicted by FIGS. 3a, 3b and 3c.

An "all-pass," illustrated in FIG. 4, is used to generate the phase rotation. If the signals $u(t)$ and $i(t)$ have a frequency of 50 Hz, they will be rotated by 90° in the all-pass. If the frequency of the signals is less than 50 Hz, the signals will be rotated in the all-pass by less than 90° in phase opposition, and if the frequency is greater than 50 Hz, they will be rotated by more than 90° in phase opposition. The factors x and y, appearing in the above equation include values which state the amount of rotation of the signals in phase opposition above, or below 90° and especially define the phase rotation of the harmonic 3 $\omega t$. The factors x and y furthermore include device-related technical data governed by the all-pass being used in the circuit. Therefore, the factors x and y can be computed only when the characteristics of the all-pass being used are precisely known.

Figure 3A:
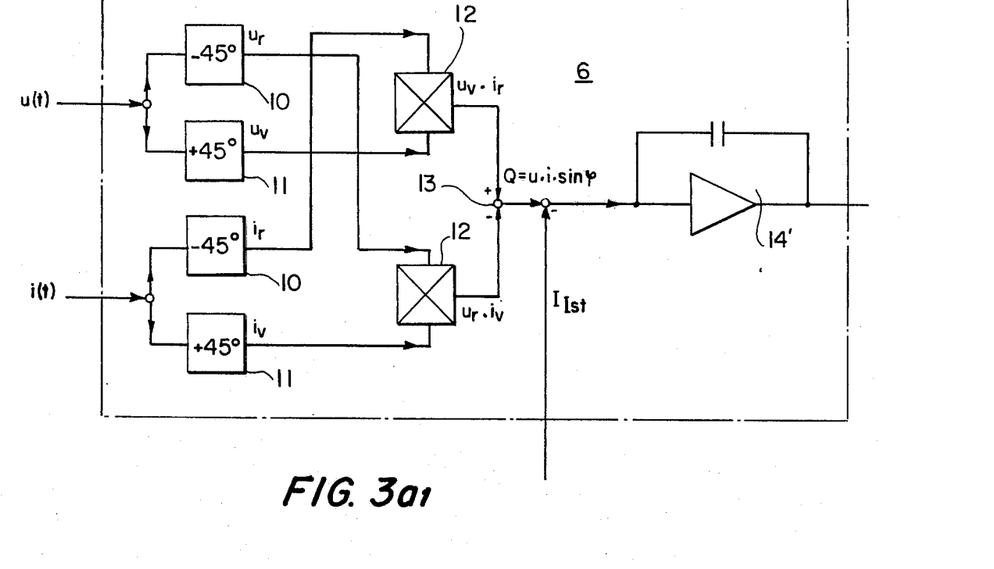
Figure 3A:
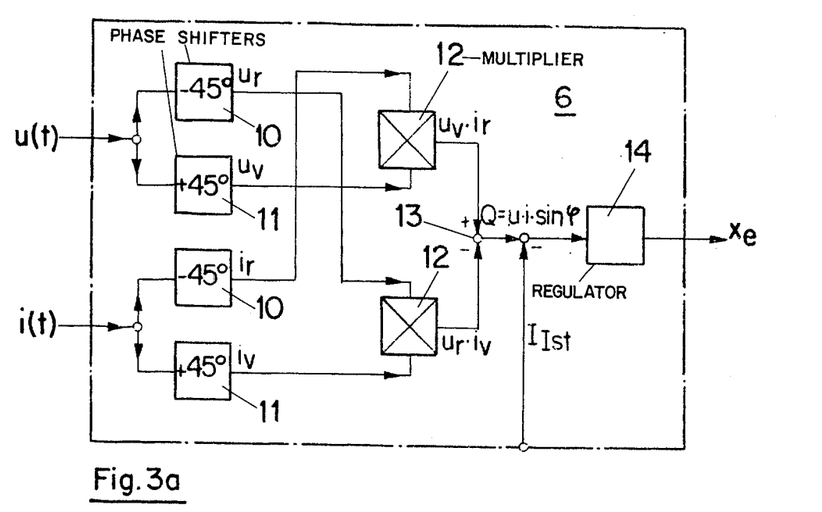
FIGS. 3a, $3a_1$, $3a_2$, $3a_3$, 3b and 3c show nominal value generators to acquire nominal values for the reactive power regulation, actual power regulation or effective, i.e., RMS value acquisition of load voltage or load current respectively with appropriately designed regulator unit circuits.

A summation of the two actual power values $P(t)$ and $Pg(t)$ results in one constant value which is determined by the actual power of the fundamental oscillation, and one fraction which is produced by the third harmonic $\hat{i}_3$ in the load current. This fraction, generated by the third harmonic $\hat{i}_3$ in the current, will produce in the resulting power signal one signal of double network frequency, and one signal of quadruple network frequency. When these two harmonic signals are compared with the actual value and the difference signal is then fed into a regulator unit 14 (see FIG. 3a) having a pure integral transfer function, the output signal of the regulator unit 14 will then be a constant signal, superimposed with the harmonic signals of 2 ω and 4 ω frequencies. These harmonic signals, appearing at the output of the regulator unit, will on the other hand be attenuated relative to the input signal and are proportionally $$\frac{\hat{u}_1 \cdot \hat{i}_3}{2\omega} \text{ and } \frac{\hat{u}_1 \cdot \hat{i}_3}{4\omega},$$

respectively.

Figure 5A:
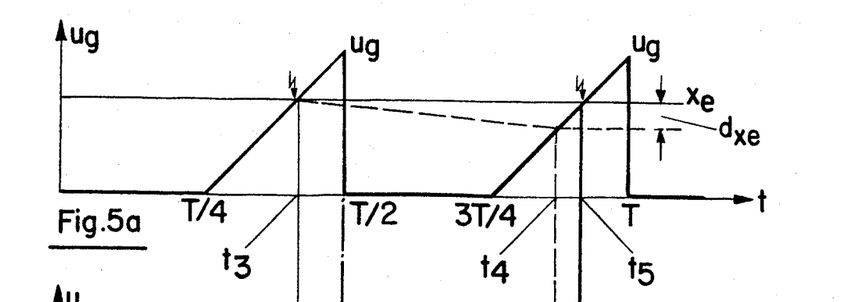
FIG. 5a depicts the two voltages being compared in the apparatus for the firing angle control shown by FIG. 1.

If this signal, with its substantially smaller content of harmonics, is fed into a control element 8 (FIG. 1) which possesses a reader, or which is designed, for example in the form of a thyristor firing angle control unit 7, to read the output signal of the regulator unit, there will be attained an error-free averaging of the signals of nominal value and actual value since any deviation of the mean actual value from the mean nominal value will cause a change in the output signal $x_e$ of the regulator unit 14, and consequently to a change in drive $d_{xe}$ by the control unit 8 (FIG. 5a).

It is the significant characteristic of the nominal value generator 6 proposed by the invention (see FIGS. 1 and 3a to 3c) that the handling systems, used to determine the reactive and actual power values of load current or load voltage, where the values represent either demand or r.m.s. values, —systems which are known per se in view of the present state of art— are followed by a regulator unit 14 with integral behavior (see FIG. 3c), thereby reducing the influence of the harmonics within the measured value signals $i(t)$, $u(t)$. The regulator unit 14 need not have a pure integral transfer function but can also be designed in the form of a PI or PID regulator.

The nominal value generator 6 of FIG. 1 is shown in FIG. 3a in the form of a circuit which will allow the acquisition of the reactive power consumption by the load 1. The two electric measuring values $i(t)$, $u(t)$ of the load current, or load voltage respectively, of load 1 are each fed into two phase sections 11 and 12 respectively which will advance, or turn back respectively, the phase of the signal measuring the current, or voltage respectively, by 45° relative to the measured load reference signal $i(t)$, $u(t)$. This is accomplished by an all-pass circuit, known per se, which contains a combination of backward and forward turning phase-shifting sections 10 and 11 as shown in FIG. 4. In order to determine the reactive power, the advanced voltage signal $u_v$ is multiplied by the back-shifted current signal $i_r$, and the advanced current signal $i_v$ with the back-shifted voltage signal $u_r$, by use of a multiplicator 12, to give an example. From the multiplied signal $u_r \cdot i_r$, forming an intermediate value, there is then subtracted the other intermediate value, formed by the multiplied signal $u_v \cdot i_r$. The signals appearing at the outputs of the multipliers 12 are guided to a collecting point 13. At the latter there is formed the differential signal from the two signals arriving from the multipliers 12. The differential signal thus generated represents an analog d.c. voltage which is proportional to the instantaneous reactive power consumption $u \cdot i \cdot \sin \phi$ of the load 1. The signal appearing at the output of the collecting point 13 is utilized as the nominal value for the control. Then the differential signal from this nominal value and the supplied instantaneous value $I_{ist}$ is formed and fed into the regulator unit 14 with integral factor.

Figure 3A:
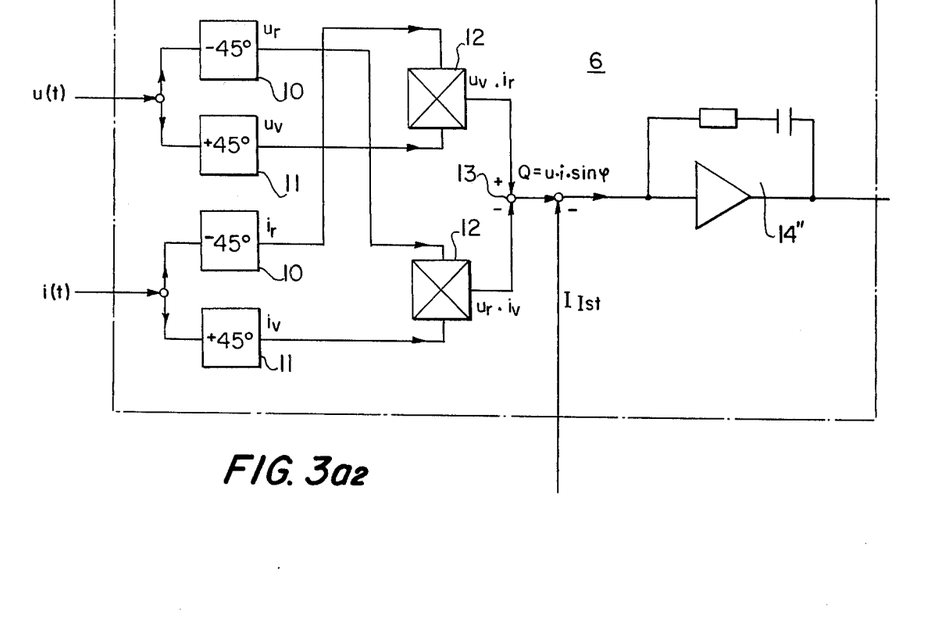
Figure 3A:
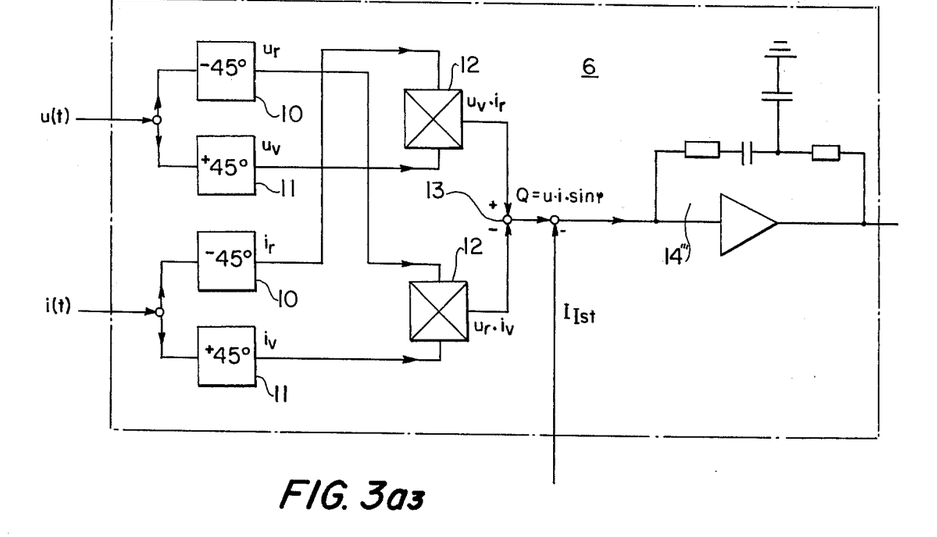
Figure 3B:
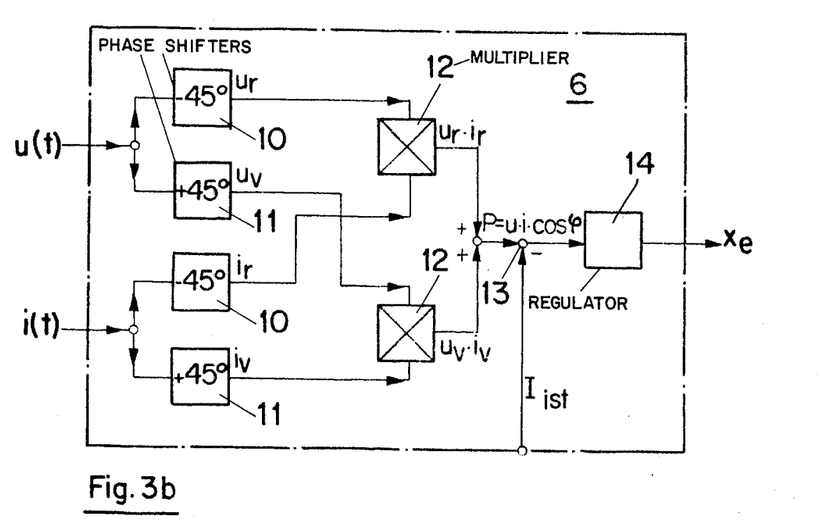

The actual power can be computed in the same manner as the reactive power by the use of a circuit arrangement shown in FIG. 3b.

One important feature of the invention is the inclusion of the regulator unit 14 which must, in addition to its other properties, possess an integral factor. Important is further the reading of the control output signal $x_e$ which can be accomplished by a separate (not illustrated) reading device with a hold element, for example a system controlling the firing angle of the thyristors. The output signal of the regulator unit, so obtained, can be employed for the actuation of a power-network-operated final control element through the apparatus controlling the firing angle. This arrangement makes possible a reading of the output signal $x_e$ from the regulator unit in synchronization with the power network, with the integration time corresponding to the reading time. The integration time will equal one-half of the oscillation period of the fundamental oscillation of the power network, or will equal one oscillation period of the fundamental oscillation, if viewed phase-wise, dependent on the circuitry of the power-network-operated final control element.

FIG. $3a_1$ is similar to FIG. 3a and shows one specific embodiment for the regulator unit 14' having an integral function.

FIG. $3a_2$ also similar to FIG. 3a shows an integrating regulator unit 14" of the known "PI" type.

FIG. $3a_3$ also similar to FIG. 3a shows an integrating regulator unit 14''' of the known "PID" type.

It is possible to acquire the value of the actual power from $i(t)$, $u(t)$, similar to the computation of the reactive power, and FIG. 3b shows a circuit to e used for this purpose.

Figures 5B, 5C:
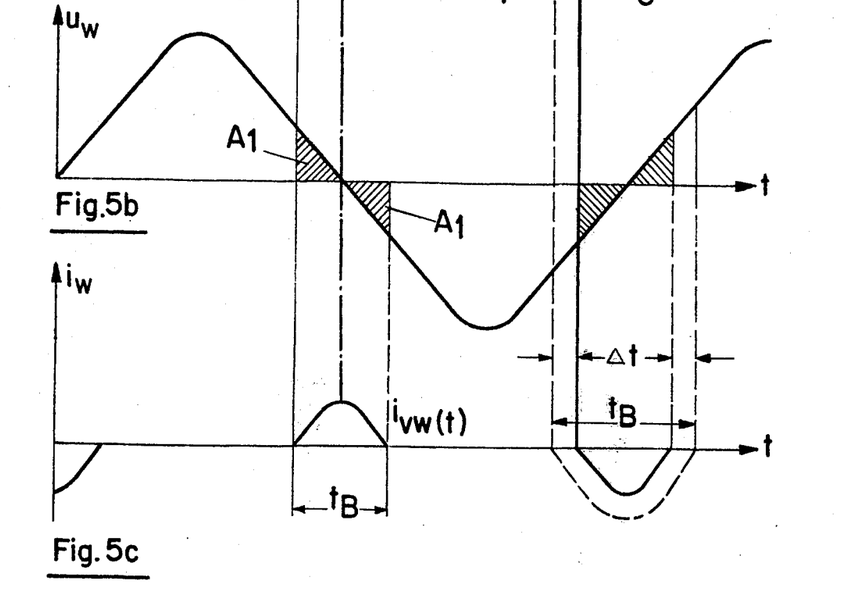
FIGS. 5b and 5c show the current-voltage ratios in the final control element of the circuit arrangement according to FIG. 1.

Instead of a rotation of the measuring signals by ± 45° relative to the reference signals $i(t)$, $u(t)$ within the power network it is also possible to select other combinations of phase rotations. For example, it is possible to multiply the non-rotated measuring signals $i(t)$, $u(t)$ with each other; the multiplied signal thus becomes the first intermediate value. The second intermediate value is then obtained by delaying the measuring signal of the voltage $u(t)$ as well as the measuring signal of the circuit $i(t)$ by an angle $\Delta \alpha = \pi/2$ or $\Delta \alpha < \pi/2$. The non-delayed measuring signals are then subtracted from the corresponding delayed measuring signals of current and voltage. If a suitable amplification of the non-delayed and the delayed measuring signals is employed, the resulting measuring signal will possess a phase rotation of $\pi/2$. This variant solution offers the advantage that the dynamic properties of the measursystem, and thus the dynamic properties of the transient error signal can be influenced in the event of transient occurrences. The output signal $x_e$ of the regulator unit 14, which possesses an integral portion in the transfer function, is fed into a firing angle control unit 7, serving there as reference voltage in connection with the release of the firing pulses for the final control element (FIG. 5a) The hatched zones $A_1$ in FIG. 5b represent the v. t. (voltage-time) areas from the null point to the electrical angle at which the thyristors are fired or quenched, respectively.

FIG. 5a illustrates in form of a time graph the voltage $u_g$ generated in the firing angle control unit 7 in functional relation to the a.c. voltage $u_w$ of the a.c. mains. The behavior of the voltage $u_w$ is depicted in FIG. 5b.

FIG. 5a also shows the characteristic of the signal output $x_e$ of the regulator as well as its change $d_{xe}$. This change is caused by an increase, or decrease respectively, of the load current $I_n$, or of the reactive current $I_b$ respectively. FIG. 5c shows the behavior of the current $i_w$ which flows through one of the two thyristors of the a.c. controller 8, its behavior functionally related to the signal output of the controller, and changing whenever a change $d_{xe}$ of this signal occurs. The time period during which one of the thyristors of the controller 8 is activated is denoted by $t_B$. This time period changes by $\Delta t$ upon a change of the signal output $x_e$ of the controller.

Within the firing angle control unit there is activated at the instant of time T/4 or 3T/4 respectively of the voltage maximum of the a.c. voltage $u(t)$ a voltage generator which will form, for example, a delta voltage $u_g$ which will increase steadily and deliver a firing pulse to the thyristors 8 of the a.c. control unit at the instant of time $t_3$ when the value of the reference voltage $x_3$ has been reached. When the a.c. voltage $u(t)$ passes through the zero point, the delta voltage $u_g$ will become zero again to begin another increase at the next voltage maximum, that is the negative voltage maximum at 3T/4. This process will be repetitive. In the example given above, the time duration between two firing pulses is T/2, in other words, the output signal $x_e$ of the regulator unit 14 will always be read after the half-cycle of the fundamental network oscillation, and that the mean nominal and mean actual values are compared at this time. If the two mean values do not coincide, the regulator unit 14 will modify the output signal $x_e$ until the two mean values do coincide (drive modification $d_{xe}$ at instant of time $t_4$).

Figure 3C:
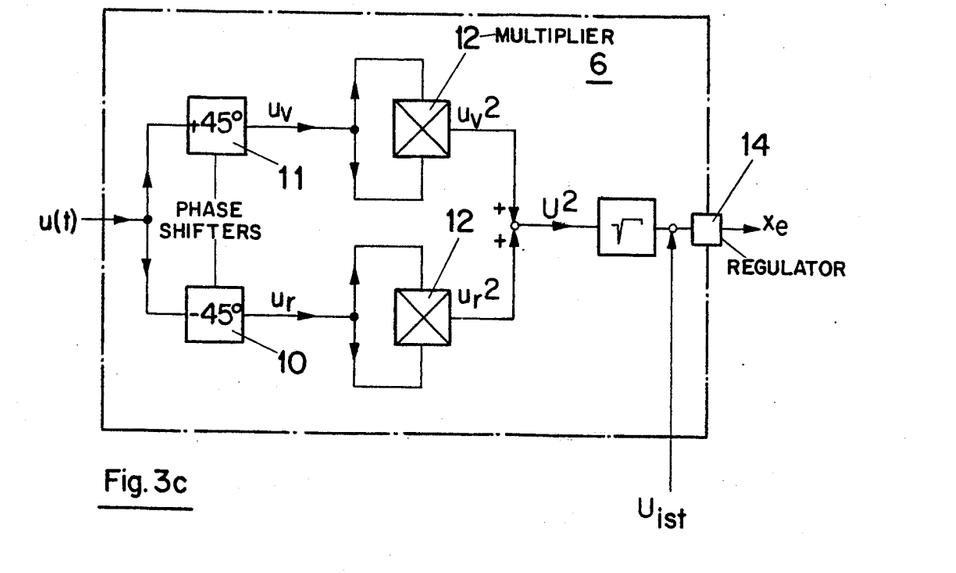

FIG. 3c illustrates how, in order to determine the root mean square i.e. effective value of the voltage, two voltage signals $u_n$, $u_v$ are formed, which are shifted in phase by 90° relative to each other and which, when multiplied by themselves, will result in the square of the leading and of the lagging voltage signals $u_n$, $u_n$, and where the two squares $u_n^2$, $u_v^2$, and added and the square root is extracted from this sum, resulting in the root mean square value $u$ of the voltage $u(t)$. This measuring voltage, which is proportional to the r.m.s. value of the load voltage, can be fed into a regulator unit 14 with an integral portion, serving as a voltage control circuit, FIG. 3c), and actuate a final current control element through a (not illustrated) firing angle control unit.

The nominal value generators, illustrated in FIGS. 3a to 3c make it feasible to acquire and use a measuring value for a rapid determination of the nominal value in conjunction with a circuit controlling the reactive power (as shown in FIG. 1.) or in conjunction with (not illustrated) regulator circuits which utilize actual power and voltage as the regulating variables. The total system, comprising a nominal value generator and a regulator circuitry, operates stationary, free of errors, and is not affected by any harmonics content.

The measuring method proposed by the invention as well as the circuit arrangement for the practical application of this method, where nominal values are fed into appropriately designed regulator circuits, are not limited to the species shown by FIG. 1. It is applicable to any controlling and regulating systems where a rapid, precise and reliable acquisition of the r.m.s. for loads with signals containing harmonics is essential, e.g. acquisition of reactive power, acquisition of actual power, r.m.s. values for current and voltage, the acquisition of reactive current and real current. This applies likewise to reading final control elements with a pulse code of $p = 1$ instead of $p = 2$. In the case of control elements with pulse codes of $p > 2$ the statement of an absolutely error-free averaging should be modified to state: almost error-free, but the error will still be slight if the integration is limited to a half or full oscillation period because the error, caused by the harmonics and present in the nominal value, will be reduced by the integration within the regulator element.

The circuit arrangement proposed by the invention offers the substantial advantage that the required averaging of the nominal value is accomplished within the regulator unit, and that therefore the periods of the averaging of the nominal value and the regulating time period of the regulator circuit will add up linearly, not independent of each other.

In place of the auxiliary inductive reactance 4 and the final a.c. control element 8, comprising controllable semiconductor valves, i.e. thyristors — as shown by FIG. 1 — it is possible to connect some other type of reactance to the load 1, either in parallel or in series, to be actuated, or shunted respectively, in case of need, by means of controllable valves, switches, or preferably control circuits. The reactances can be in the form of reactance transformers with short-circuitable secondary windings to influence the power factor. The a.c. control elements can also be designed in the form of reactive converters, forced commutating three-phase bridges and the like, which will maintain the power factor, or the voltage respectively, at a pre-set value through an appropriately designed firing angle control unit.

The nominal value generator can further be used in connection with regulator circuits with a final a.c. control element which is either a power-network-operated converter, a self-operated converter, or a load-operated converter.

The inventive idea is not limited to circuits which regulate voltage, current and power of electric loads but is also applicable to non-electrical measuring values which can be converted into electric quantities and subjected to further handling.

I claim:

1. Apparatus for monitoring inductive reactive power within an a.c. voltage supply mains, comprising an inductive reactance component connected to said a.c. mains in parallel with a load circuit supplied by said mains, means connected in series with said reactance component for adjusting current flow therethrough, means deriving an a.c. voltage signal indicative of the voltage in said load circuit, means deriving an a.c. current signal indicative of the current flowing in said load circuit, means including phase shifting means for producing from said a.c. voltage and current signals an analog d.c. voltage proportional to the instantaneous reactive power consumption of the load and which represents the nominal value for the control, means deriving an analog d.c. signal voltage proportional to the instantaneous value of the current in the circuit containing said reactance, means comparing said analog d.c. voltages and producing a differential d.c. voltage signal, a regulator having an integral section, means connecting last said differential d.c. voltage signal to the input of said regulator, means for periodically reading the output signal from said regulator, and means connecting the periodically read output of said regulator to said means for adjusting the current flow through said reactance.

2. Apparatus as defined in claim 1 for monitoring inductive reactive power within an a.c. supply mains wherein said means for adjusting the current flow through said reactance is constituted by a two-way semi-conductor arrangement connected in series with said reactance and said means for periodically reading the output from said regulator is constituted by a firing angle control unit for said two-way semi-conductor arrangement.

3. Apparatus as defined in claim 1 for monitoring inductive reactive power within an a.c. supply mains wherein said inductive reactance component is constituted by leakage reactance transformer whose primary is connected in parallel with said load circuit and wherein said means for adjusting the current flow through said reactance is constituted by a two-way semi-conductor control arrangement connected to the secondary of said transformer and controlled by said means periodically reading the output signal from said regulator.

4. Apparatus as defined in claim 1 for monitoring inductive reactive power within an a.c. supply mains wherein said regulator is of the integrating type.

5. Apparatus as defined in claim 1 for monitoring inductive reactive power within an a.c. supply mains wherein said regulator is of the PI type.

6. Apparatus as defined in claim 1 for monitoring inductive reactive power within an a.c. supply mains wherein said regulator is of the PID type.

7. Apparatus as defined in claim 1 for monitoring inductive reactive power within an a.c. supply mains wherein said means for adjusting the current flow through said reactance is constituted by a pair of anti-parallel connected thyristors.

8. Apparatus as defined in claim 1 for monitoring inductive reactive power within an a.c. supply mains wherein said inductive reactance is constituted by an auxiliary inductive choke.

9. Apparatus as defined in claim 1 for monitoring inductive reactive power within an a.c. supply mains wherein said phase shifting means included in said means for producing from a.c. voltage and current signals an analog d.c. voltage proportional to the instantaneous reactive power consumption of the load is constituted by means shifting said voltage signal forwardly and backwardly by 45° thereby to obtain two other voltage signals with a 90° phase difference, means shifting said current signal forwardly and backwardly by 45° thereby to obtain two other current signals with a 90° phase difference, first means for multiplying the forward shifted voltage signal with the backward shifted current signal, second means for multiplying the backward shifted voltage signal with the forward shifted current signal, and means for comparing the respective outputs of said first and second multiplying means and producing the differential signal.

* * * * *